(12) United States Patent
Haas et al.

(10) Patent No.: US 8,718,215 B2
(45) Date of Patent: *May 6, 2014

(54) METHOD AND APPARATUS FOR DESKEWING DATA TRANSMISSIONS

(71) Applicant: Altera Canada Co., Toronto (CA)

(72) Inventors: Wally Haas, Mt. Pearl (CA); Mutema John Pittman, St. John's (CA)

(73) Assignee: Altera Canada Co., Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/932,637

(22) Filed: Jul. 1, 2013

(65) Prior Publication Data

US 2013/0294555 A1    Nov. 7, 2013

Related U.S. Application Data

(63) Continuation of application No. 12/636,947, filed on Dec. 14, 2009, now Pat. No. 8,498,370.

(51) Int. Cl.
*H04L 25/40*    (2006.01)

(52) U.S. Cl.
USPC .......................................... 375/371

(58) Field of Classification Search
CPC ............................. H04L 7/033; H04L 7/0337
USPC .......... 375/371, 354, 355, 373, 376; 327/100, 327/141, 144, 146
See application file for complete search history.

(56) References Cited

U.S. PATENT DOCUMENTS

| | | | |
|---|---|---|---|
| 6,438,155 B1 | 8/2002 | Beale | |
| 6,690,201 B1 | 2/2004 | Simkins et al. | |
| 6,750,688 B2 * | 6/2004 | Takai | 327/158 |
| 7,164,742 B2 | 1/2007 | McLeod | |
| 2008/0080649 A1 | 4/2008 | Gibbons et al. | |

* cited by examiner

*Primary Examiner* — Khai Tran
(74) *Attorney, Agent, or Firm* — Ropes & Gray LLP

(57) ABSTRACT

The present invention discloses a method and apparatus for addressing the issue of clock skew in a data signal while making efficient use of space on an integrated chip (IC) by utilizing a physical delay line controlled by a state machine in conjunction with pre-requisite chip architecture. The pre-requisite chip architecture samples the incoming data signal in response to a clocking signal input from the physical delay line; the physical delay line responds to commands from the state machine to increment the delay of the physical delay line to produce samples which describe the incoming data signal and delineate its data valid window.

20 Claims, 3 Drawing Sheets

METHOD AND APPARATUS FOR DESKEWING DATA TRANSMISSIONS

CROSS-REFERENCE TO RELATED APPLICATIONS

This application is a continuation of co-pending, commonly assigned U.S. patent application Ser. No. 12/636,947, filed Dec. 14, 2009, which claims priority from Canadian Patent Application No. 2682103, filed Oct. 27, 2009, which are hereby incorporated by reference in their entireties.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Technical Field of the Invention

The present invention relates to the correction of clock skew in a data transmissions system.

2. Background of the Invention

As the complexity of integrated circuits (ICs) increases, the speed at which they process information also increases. The speeds at which contemporary systems process data have increased such that a single chip may contain billions of transistors. Synchronized by a single system clock, billion-transistor ICs are often clocked at speeds greater than 2 Gigahertz (GHz). At these speeds, the timing signals for data transmission and data processing have such minute periods that they are easily disrupted or distorted. Variations in temperature, electromagnetic interference from neighbouring transmission lines, and even the minute resistance offered by transmission lines can introduce skew in the timing of data transmissions.

One method for reducing the effects of clock skew while efficiently utilizing the space on an IC is the serial transmission of parallel data between elements on a board. By converting parallel data into a single bit-by-bit sequential stream that travels from chip to chip, the possibility for skew is reduced by decreasing the number of physical channels which connect the source to its destination. Reducing a plurality of transmission lines to a single line eliminates the need to synchronize several datapaths, any one of which may be skewed. Due to the small amount of space allocated for each transmission line, interference or "crosstalk" between lines can occur in parallel transmission; a single transmission line is comparatively isolated and insulated, minimizing the opportunities for interference. Serial transmission is also more efficient in terms of space, as fewer pins are required on the chip to receive or send data. These differences do not only admit less skew in data transmission: the relative resistance of serial data transmission to the effects of clock skew also means that serial data transmissions may be clocked at higher frequencies than parallel data transmissions, as the user can have more confidence that serial data transmissions will not become as skewed as parallel data transmissions. The conversion of parallel data into a serial transmission requires the use of a Serializer/Deserializer (SerDes), which consists of a pair of logic blocks on either side of the transmission system, with one logic block on the transmit side to convert the parallel data into serial data, and another logic block at the receive side to convert the serial data back to parallel data.

Paradoxically, because serial data can be transmitted faster due to its relative resistance to the causes of skew, systems adapted for these higher data rates are more sensitive to variations in timing. Thus it is necessary to introduce additional means on the IC to discover and eliminate any skew that may have occurred in transmission. Employing a phase-locked loop (PLL) or a delay-locked loop (DLL) in the clock path of a circuit are common and effective methods for correcting clock drift. These circuits operate by comparing the input (or reference) signal with a second signal, and using the difference in phase or delay between those two signals to produce a third output signal which is fed back into the input of the circuit and is to be compared with the reference signal. If the difference between the output signal and the input signal drifts too far, the resultant differential signal pushes the frequency in whichever direction is required to correct the error, thereby eliminating skew.

While PLLs and DLLs are effective devices for correcting skew among data signals, they do not necessarily make efficient use of available chip space. Both PLLs and DLLs require a plurality of elements to be installed on an IC in order to function. An analog PLL requires a phase comparator, a low-pass filter, a voltage-controlled oscillator, and a clock divider; digital PLLs replace the oscillator with an additional clock and a counter to perform the same function. DLLs include an array of multiplexers to manipulate the delay of the output clock signal. On ICs where space is already at a premium, it is necessary to find a more space-efficient method of deskewing data signals.

Methods for sampling incoming data signals and deskewing said data signals without resorting to PLLs or DLLs are known in the prior art, but none of the prior art utilises a physical delay line controlled by a state machine to induce pre-existing chip architecture to create samples of an incoming data signal for the purposes of describing the data valid window of the incoming data signal and adjusting the clock signal of said incoming data signal to an optimum position within said data valid window.

BRIEF SUMMARY OF THE INVENTION

It is an object of the present invention to address the issue of clock skew without resorting to PLLs or DLLs, which do not make efficient use of the space on ICs. The present invention makes use of a delay line controlled by a state machine as well as pre-requisite chip architecture, e.g. in the illustrative embodiment the deserializing block, or Serial-In Parallel-Out (SIPO) block, to correct clock skew in incoming data transmissions. In utilising elements required by the design of the chip itself, the present invention corrects skew without necessitating the addition of elements as complex as those required by PLLs and DLLs. The SIPO block comprises a series of flip-flops which register individual bits of data that are input serially from a transmission line to the input of the first flip-flop in the series; these bits are then read from the output of each flip-flop, generating the parallel data stream. Data are entered individually on a latching edge of the clock signal; in an illustrative embodiment of the invention, wherein the invention is applied to a Single Data Rate (SDR) architecture, this is a positive edge, i.e. when the signal transitions from a low state to a high state. Please note that this embodiment is provided for illustrative purposes only and is not meant to limit the scope of the present invention, as other architectures may be accommodated. For example, the present invention may be applied to a Dual Data Rate (DDR) architecture, where the latching edges of the clock signal may be both positive and negative edges. The flip flops activated by the latching edges of the clock signal sample the incoming serial data and said samples are used to determine if the timing of the data signal has drifted from that of the system clock.

In the present invention, this determination is made by a state machine into which the sampled data are fed. The state machine requests a plurality of samples from the deserializer and adjusts the position of the clock edge after each request via a physical delay line. Doing so provides samples from a variety of positions through the data signal's period. The state machine requests samples until it can see the signal's data valid window, i.e. until it can determine the portion of the period during which valid data can be read. The window lies in a region between transition edges of the signal, free of the uncertainty of jitter that may occur at transitions. The state machine employs an algorithm to determine where the data valid window is located, and the clock signal is adjusted so that any latching edges are aligned with the centre of the data valid window, thereby eliminating the effect of clock skew. The location of the data valid window is stored in a register so that the location of the data valid window may be made visible to the user.

DETAILED DESCRIPTION OF THE INVENTION

The present invention discloses a method and apparatus for deskewing a serialized data signal in an integrated circuit. The apparatus makes use of existing chip architecture in conjunction with a state machine to repeatedly sample an incoming signal and use the collected samples to determine the incoming signal's data valid window. The state machine decides whether or not the location of the centre of the data valid window is synchronized with the system clock signal and adjusts the data signal accordingly, thereby eliminating the effect of clock skew.

Figure 1:
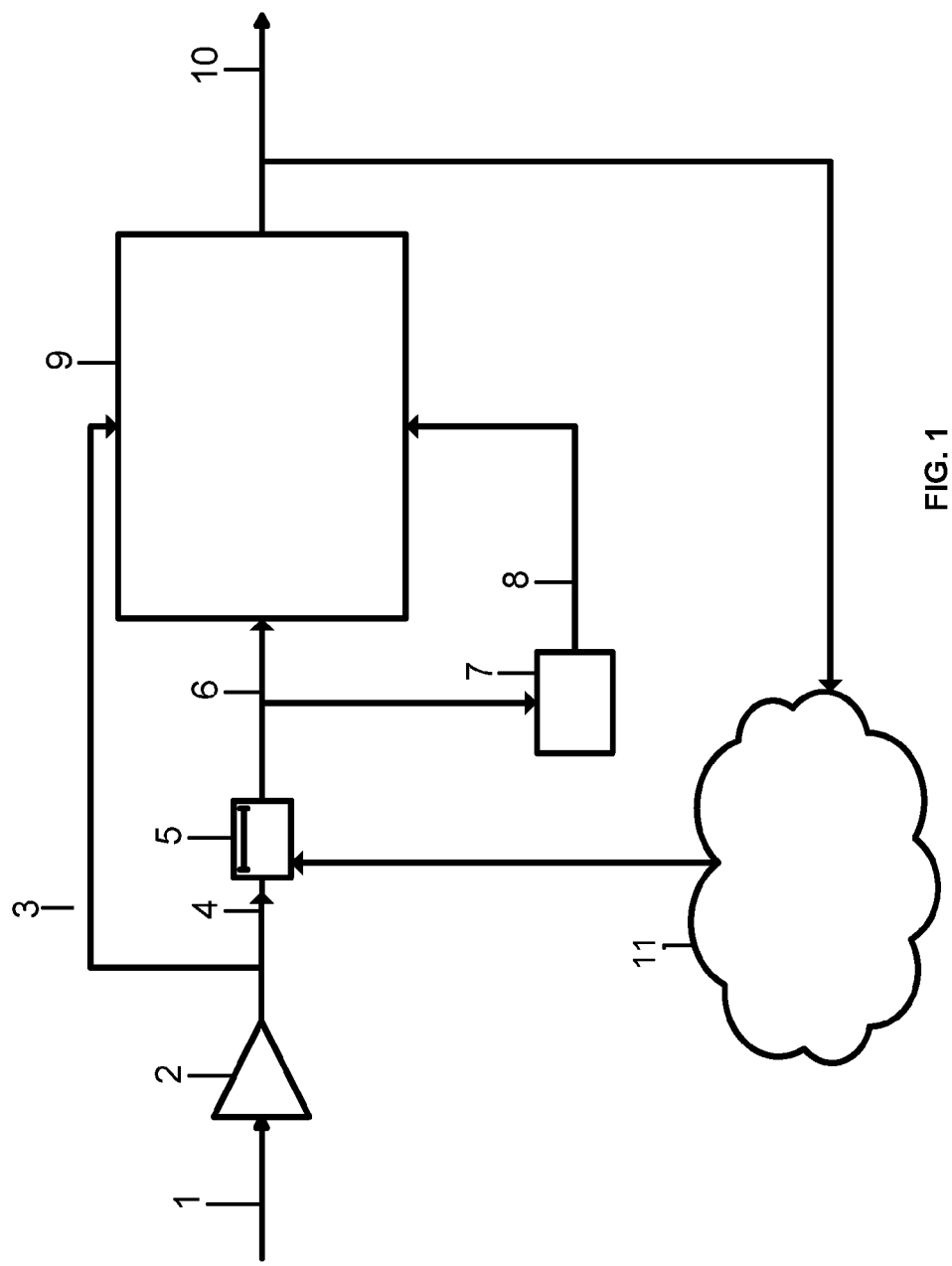
FIG. 1 is a block diagram illustrating the circuitry of the present invention.

FIG. 1 illustrates the deskew apparatus disclosed by the present invention. Serial data (1) arrives from an adjoining chip or element (not shown) and is buffered in an input buffer (2). The buffered data signal, DATAb (3), is transmitted to an n-bit Serial-In Parallel-Out (SIPO) block (9), where n is the number of bits to be transmitted in parallel after the signal has been deserialized. The clock signal, CLKin (4), which times DATAb(3), is delayed by a physical delay element (5). The delayed clock signal, CLKd (6), is sent through an n-clock divider (7) to generate a clock signal (CLKn) with a period of CLKd/n (8). CLKd is sent to the SIPO block (9) to time DATAb (3).

At the SIPO block (9), DATAb (3) is deserialized and sampled in an n-bit demultiplexer within the SIPO block (not shown), comprising a series of n flip-flops triggered on the rising (or positive) edge of CLKd (6). A second set of n flip-flops utilize CLKn (8) as a selector clock to pull the data out of the first set of flip-flops according to the state of CLKn (8). N bits of data are transmitted in parallel as DATAout (10) after DATAb (3) has been deserialized. The results of the sampled data are fed through the state machine (11), which increments the delay of the delay element (5) a predetermined number of times to obtain additional sample sets. Each increment of delay produces CLKd(x), where x is a consecutive iteration of delay, and each iteration is a regular increment of delay in relation to the original period of CLKin. Each progressive delay of CLKd also alters the delay of CLKn, producing similarly iterative clock signals, CLKn(x).

After the state machine (11) has sampled DATAb through the predetermined number of iterations of delay, the state machine (11) uses an algorithm to ascertain the centre of the signal's "flat region," or the data valid window; this is the portion of the data signal's period between transitions of the data signal during which the data itself is stable. Clock signal transitions should be adjusted such that clock edges which trigger flip-flops or latches occur in the centre of the data valid window, in order to allow the data signal enough time to become stable (this referred to as "setup time"), and stay stable long enough to be acted upon (this is referred to as "hold time"). Having determined the location of the centre of the data valid window, the state machine (11) uses this location to determine whether the timing of the data signal has become skewed from the expected clock rate. If any skew has become apparent, the state machine (11) adjusts the delay element (5) accordingly, adjusting the clock signal (3) so that transitions occur in the centre of the data valid window. The results of the sampling and the determination of the data valid window are made user-visible by the state machine (11), by storing the results in a register (not shown) to be read by the user.

DESCRIPTION OF AN ILLUSTRATIVE EMBODIMENT OF THE INVENTION

The following is an illustrative embodiment of the present invention and is not intended to limit the scope, applicability or configuration of the invention in any way. It will be readily apparent to one of ordinary skill in the art that the present invention may be implemented in numerous embodiments.

The illustrative embodiment discloses the sampling and deserialization of a data transmission in a 2-bit SIPO with of a 2-bit demultiplexer, said demultiplexer comprising 2 flip-flops timed by CLKd(x) coupled to 2 additional flip-flops timed by selecting clock CLK2($x$). CLK2($x$) has a period of CLKd(x)/2. The result of the deserialization, DATAout (10), is a stream of data comprising data transmitted in parallel 2 bits at a time.

Figure 2:
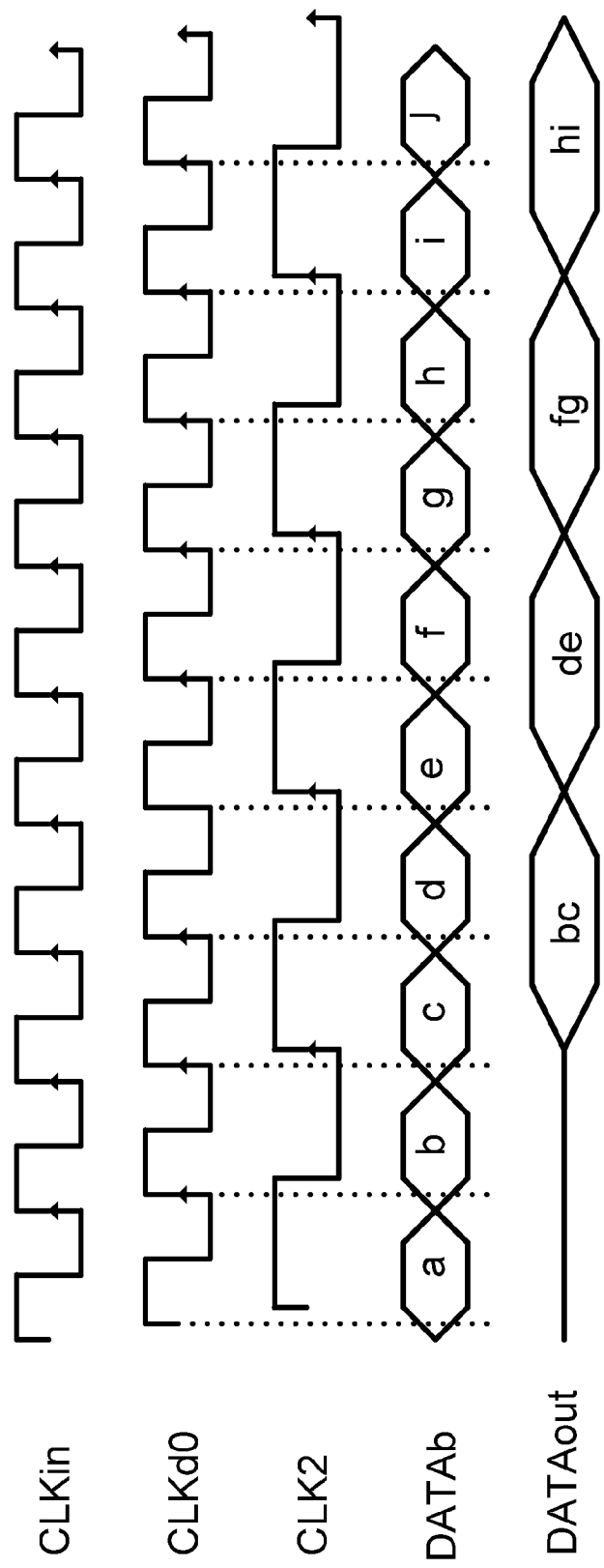
FIG. 2 depicts the sampling and deserializing of a serial three state data signal in accordance with an illustrative embodiment of the present invention.

FIG. 2 illustrates the process of sampling and deserializing DATAb. In FIG. 2, DATAb is an exemplary three-state data signal to be sampled by CLKd, where x=0. As described in the detailed description of the invention, samples are taken on the positive edge of CLKd0; this sampling is represented by vertical dotted lines. As illustrated in FIG. 2, DATAb is shifted by the 2-bit SIPO block from a stream of serial bits of data (a, b, c, d, etc.) into a stream of data where two bits are transmitted in parallel (bc, de, ef, etc.). Although the first bit of DATAb (3) (a) enters the SIPO (9), it is not transmitted in parallel as the selecting clock (8) for the demultiplexer does not begin until after the data has already been transmitted.

Figure 3:
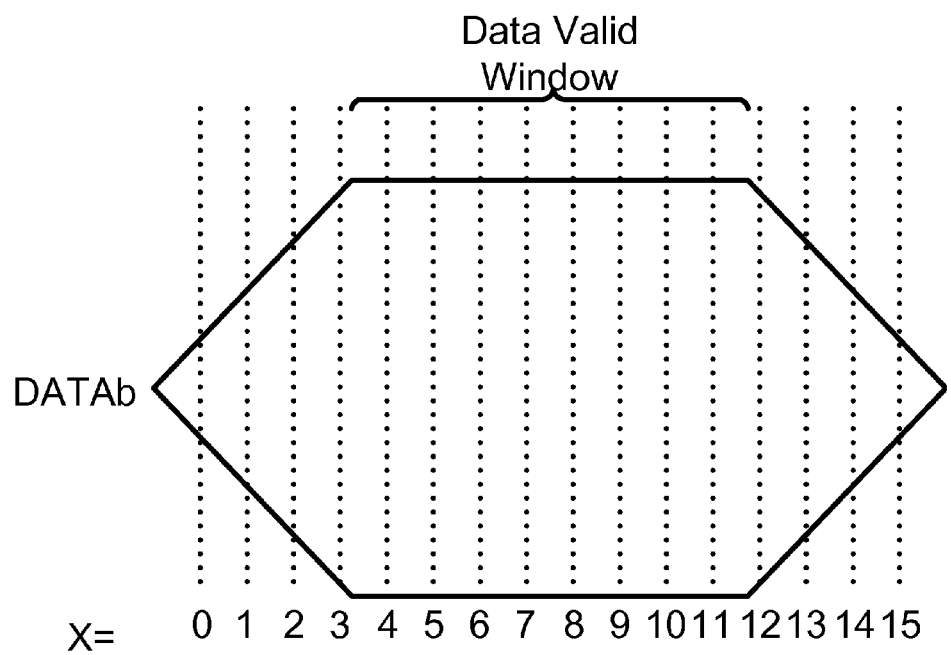
FIG. 3 depicts the data valid window of a three state data signal in accordance with an illustrative embodiment of the present invention.
Figure 4:
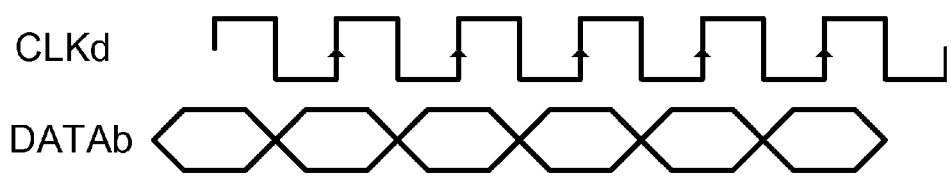
FIG. 4 depicts a deskewed three state data signal and a deskewed timing signal in accordance with an illustrative embodiment of the present invention.

As illustrated in FIG. 2, all the samples taken by CLKd0 occur before the signal itself has become stable. In the illustrative embodiment, the state machine (11) increments the delay 16 times in even steps, as shown in FIG. 3, where values of x=0 . . . 15. Each set of samples provides the state machine (11) with information about the state of DATAb (3); once all 16 sets have been received, an algorithm determines where the centre of the data valid window is for DATAb(3). Once the state machine (11) has determined the centre of the data valid window, as shown in FIG. 4, it adjusts the delay of CLKd (6) once more to re-position the clock signal such that the positive edge of CLKd (6) occurs in the middle of the data valid window, eliminating any skew that may have occurred. The results of the data samples are stored in a register (not shown) in the state machine (11) to be read by the user.

What is claimed is:

1. A method of correcting skew in at least one transmitting lane, in a data transmission system, comprising:
    receiving a data signal from the at least one transmitting lane, wherein the data signal is associated with a plurality of data valid windows, each of the data valid windows including a stable portion of the data signal;
    sampling the data signal, using at least one circuit element, at successive intervals, based on a timing signal, to obtain a plurality of data samples;
    processing the plurality of data samples to determine a mean length of each of the plurality of data valid windows and a median position of the mean length; and
    adjusting the timing signal to allow sampling of the data signal to occur in the median position of the mean length of each of the plurality of data valid windows.

2. The method of claim 1, wherein the timing signal comprises a plurality of latching edges.

3. The method of claim 1, wherein the processing occurs using an algorithm implemented on a state machine.

4. The method of claim 1, wherein the adjusting the timing signal comprises adding a delay to the timing signal relative to the data signal.

5. The method of claim 1, wherein the at least one circuit element comprises a plurality of flip-flops.

6. The method of claim 5, wherein the plurality of flip-flops is in series, and wherein the plurality of data samples is obtained in parallel.

7. The method of claim 1, wherein the data signal is a serial data signal.

8. A system of correcting skew, the system comprising:
    at least one transmitting lane to receive a data signal, wherein the data signal is associated with a plurality of data valid windows, each of the data valid windows including a stable portion of the data signal;
    at least one circuit element to sample the data signal at successive intervals, based on a timing signal, to obtain a plurality of data samples;
    a state machine to process the plurality of data samples to determine a mean length of each of the plurality of data valid windows and a median position of the mean length; and
    a delay element to adjust the timing signal to allow sampling of the data signal to occur in the median position of the mean length of each of the plurality of data valid windows.

9. The system of claim 8, wherein the timing signal comprises a plurality of latching edges.

10. The system of claim 8, wherein an algorithm implemented on the state machine processes the plurality of data samples.

11. The system of claim 8, wherein the delay element is operable to add a delay to the timing signal relative to the data signal.

12. The system of claim 8, wherein the at least one circuit element comprises a plurality of flip-flops.

13. The system of claim 12, wherein the plurality of flip-flops is in series, and wherein the plurality of flip-flops obtains the plurality of data samples in parallel.

14. The system of claim 8, wherein the data signal is a serial data signal.

15. An integrated circuit (IC) comprising a plurality of circuit elements, the circuit elements operable to:
    receive a data signal, wherein the data signal is associated with a plurality of data valid windows, each of the data valid windows including a stable portion of the data signal;
    sample the data signal at successive intervals, based on a timing signal, to obtain a plurality of data samples;
    process the plurality of data samples to determine a mean length of each of the plurality of data valid windows and a median position of the mean length; and
    adjust the timing signal to allow sampling of the data signal to occur in the median position of the mean length of each of the plurality of data valid windows.

16. The IC of claim 15, wherein the timing signal comprises a plurality of latching edges.

17. The IC of claim 15, one circuit element of the plurality of circuit elements includes a state machine, and wherein an algorithm implemented on the state machine processes the plurality of data samples.

18. The IC of claim 15, wherein one circuit element of the plurality of circuit elements includes a delay element, and wherein the delay element is operable to add a delay to the timing signal relative to the data signal.

19. The IC of claim 15, wherein the plurality of circuit elements includes a plurality of flip-flops.

20. The IC of claim 15, wherein the data signal is a serial data signal.

* * * * *